United States Patent
Minamihaba et al.

(10) Patent No.: US 7,419,910 B2
(45) Date of Patent: Sep. 2, 2008

(54) SLURRY FOR CMP, POLISHING METHOD AND METHOD OF MANUFACTURING SEMICONDUCTOR DEVICE

(75) Inventors: Gaku Minamihaba, Yokohama (JP); Dai Fukushima, Kamakura (JP); Susumu Yamamoto, Oita (JP); Hiroyuki Yano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 131 days.

(21) Appl. No.: 10/932,096

(22) Filed: Sep. 2, 2004

(65) Prior Publication Data

US 2005/0118821 A1    Jun. 2, 2005

(30) Foreign Application Priority Data

Nov. 27, 2003   (JP) .............................. 2003-398163

(51) Int. Cl.
  *H01L 21/302* (2006.01)
(52) U.S. Cl. ..................... 438/692; 252/79.1
(58) Field of Classification Search ................. 438/690, 438/691, 692, 693; 252/79.1; 451/287, 288
  See application file for complete search history.

(56) References Cited

U.S. PATENT DOCUMENTS

| | | | |
|---|---|---|---|
| 6,063,306 A | | 5/2000 | Kaufman et al. |
| 6,143,658 A | * | 11/2000 | Donnelly et al. ............. 438/687 |
| 6,375,545 B1 | * | 4/2002 | Yano et al. .................... 451/36 |
| 6,416,685 B1 | * | 7/2002 | Zhang et al. ................ 252/79.1 |
| 6,568,997 B2 | * | 5/2003 | Costas et al. .................. 451/41 |
| 6,576,554 B2 | * | 6/2003 | Matsui et al. ............... 438/693 |
| 6,620,215 B2 | | 9/2003 | Li et al. |
| 6,740,590 B1 | * | 5/2004 | Yano et al. .................. 438/692 |
| 2002/0016275 A1 | | 2/2002 | Hiroyuki et al. |
| 2002/0173243 A1 | * | 11/2002 | Costas et al. .................. 451/41 |
| 2003/0017785 A1 | | 1/2003 | Ueda et al. |
| 2003/0104669 A1 | | 6/2003 | Minamihaba et al. |
| 2004/0065021 A1 | * | 4/2004 | Yoneda et al. ................. 51/298 |
| 2004/0115944 A1 | * | 6/2004 | Matsui ......................... 438/692 |
| 2004/0161932 A1 | * | 8/2004 | Matsui et al. ............... 438/689 |
| 2005/0014890 A1 | * | 1/2005 | Small et al. .................. 524/556 |

(Continued)

FOREIGN PATENT DOCUMENTS

CN    1312845 A    9/2001

(Continued)

OTHER PUBLICATIONS

People's Republic of China Notification of First Office Action mailed Apr. 28, 2006, and English translation thereof.

(Continued)

*Primary Examiner*—Kin-Chan Chen
(74) *Attorney, Agent, or Firm*—Finnegan, Henderson, Farabow, Garrett & Dunner, L.L.P.

(57) ABSTRACT

Disclosed is a CMP slurry comprising a Cu oxidizing agent, a complexing agent for forming a Cu organic complex, a surfactant, an inorganic particle, and a resin particle containing polystyrene, having on the surface thereof a functional group of the same kind of polarity as that of the inorganic particle and having an average particle diameter of less than 100 nm, the resin particle being incorporated at a concentration of less than 1% by weight.

12 Claims, 4 Drawing Sheets

U.S. PATENT DOCUMENTS

2005/0176250 A1 * 8/2005 Takahashi et al. .......... 438/691

FOREIGN PATENT DOCUMENTS

| CN | 1333319 A | 1/2002 |
| CN | 1453328 A | 11/2003 |
| JP | 2001-152135 | 6/2001 |
| JP | 2002-30271 | 1/2002 |
| JP | 2002-110597 | 4/2002 |
| JP | 2003-313542 | 11/2003 |
| WO | WO 03/021651 * | 3/2003 |

OTHER PUBLICATIONS

Taiwanese Patent Office Notification of First Office Action in co-pending application 093135901 and English language translation thereof, 2006.

* cited by examiner

SLURRY FOR CMP, POLISHING METHOD AND METHOD OF MANUFACTURING SEMICONDUCTOR DEVICE

CROSS-REFERENCE TO RELATED APPLICATIONS

This application is based upon and claims the benefit of priority from prior Japanese Patent Application No. 2003-398163, filed Nov. 27, 2003, the entire contents of which are incorporated herein by reference.

BACKGROUND OF THE INVENTION

1. Field of the Invention

The present invention relates to a slurry to be used for CMP (Chemical Mechanical Polishing), a polishing method using the slurry, and a method of manufacturing a semiconductor device.

2. Description of the Related Art

It is expected that the integration of semiconductor elements in high performance LSIs of the next generation would be inevitably further enhanced. For example, the design rule of damascene wirings to be formed by CMP is expected to become so severe that the line width of wirings is confined within the range of 0.07 to 30 μm and the film thickness of wirings is confined to 100 nm or less. In the manufacture of such high performance LSIs, the magnitude of dishing to be generated on the occasion of CMP is required to be suppressed to 30 nm or less.

In the formation of Cu damascene wirings, a Cu film is ordinary deposited by a process employing plating. Due to the characteristics of plating, it is impossible to deposit the Cu film with uniform film thickness, so that in a region where a wiring trench having a width of 0.07 μm is arranged at a high density (coverage ratio: 50%), the Cu film is deposited thickly because of over-plating. In the region other than the aforementioned region, for example in the region where a wiring trench having a width of 30 μm is formed, a Cu film is deposited up to a film thickness reflecting the projected/recessed surface of underlying substrate. On the occasion of flattening the surface of the Cu film deposited in this manner by CMP, it is required, for the purpose of avoiding the short circuit of wirings, to prevent as much as possible the residue of Cu in the region of over-plating. At the same time, it is also required, in the regions other than that of over-plating, to suppress the magnitude of dishing to 30 nm or less.

With a view to minimize the dishing and scratch and to polish the Cu film at a high polishing rate, there has been proposed a slurry containing a first surfactant which is capable of interacting with Cu and a second surfactant which is incapable of interacting with Cu. In this case, the residue of Cu in the aforementioned region of over-plating would be about 33 nm for example (in the case of CuCMP, an over-polish of just+30%). On the other hand, the dishing in the region of 30 μm wirings would be 30 nm or so.

With a view to further enhance the hydrophilicity of a Cu surface-protecting film, there has been proposed a slurry containing two kinds of heterocyclic compounds. In this case, the residual Cu film in the aforementioned region of over-plating can be improved up to 15 nm or so (in the case of CuCMP, an over-polish of just+30%). In the region of 30 μm wirings, the dishing can be reduced to 25 nm or so.

With a view to enhance the polishing rate of Cu, there has been proposed a slurry containing chelate resin particles and inorganic particles. In this case, the ratio in particle size between the resin particle and the inorganic particle is 30 or more. Namely, it is impossible, with employment of this slurry, to suppress the dishing and to improve the residual Cu in the region of over-plating.

In the CMP of next generation, it is now desired that in the region where the width of wirings is set to 0.07 μm and the coverage ratio is set to 50%, the residual Cu after CMP should be confined to 2 nm or less, and in the region where the width of wirings is set to 30 μm, the dishing should be suppressed to 30 nm or less. At present however, it is considered very difficult to achieve these desirable features.

BRIEF SUMMARY OF THE INVENTION

A CMP slurry according to one aspect of the present invention comprises a Cu oxidizing agent; a complexing agent forming a Cu organic complex; a surfactant; an inorganic particle; and a resin particle containing polystyrene, having on the surface thereof a functional group of the same kind of polarity as that of the inorganic particle and having an average particle diameter of less than 100 nm, the resin particle being incorporated at a concentration of less than 1% by weight.

A polishing method according to one aspect of the present invention comprises contacting a polishing surface of a semiconductor substrate with a polishing pad attached to a turntable; and dropping a CMP slurry onto the polishing pad to polish the polishing surface, the CMP slurry comprising a Cu oxidizing agent; a complexing agent forming a Cu organic complex; a surfactant; an inorganic particle; and a resin particle which is incorporated at a concentration of less than 1 wt %, contains polystyrene, has on the surface thereof a functional group of the same kind of polarity as that of the inorganic particle and has an average particle diameter of less than 100 nm.

A method of manufacturing a semiconductor device according to one aspect of the present invention comprises forming an insulating film above a semiconductor substrate; forming a recessed portion in the insulating film; depositing a conductive material inside the recessed portion and above the insulating film to form a conductive layer; and removing the conductive material which is deposited above the insulating film by CMP using a CMP slurry to selectively leave the conductive material in the recessed portion, the CMP slurry comprising a Cu oxidizing agent; a complexing agent forming a Cu organic complex; a surfactant; an inorganic particle; and a resin particle which is incorporated at a concentration of less than 1 wt %, contains polystyrene, has on the surface thereof a functional group of the same kind of polarity as that of the inorganic particle and has an average particle diameter of less than 100 nm.

DETAILED DESCRIPTION OF THE INVENTION

Figure 1A:
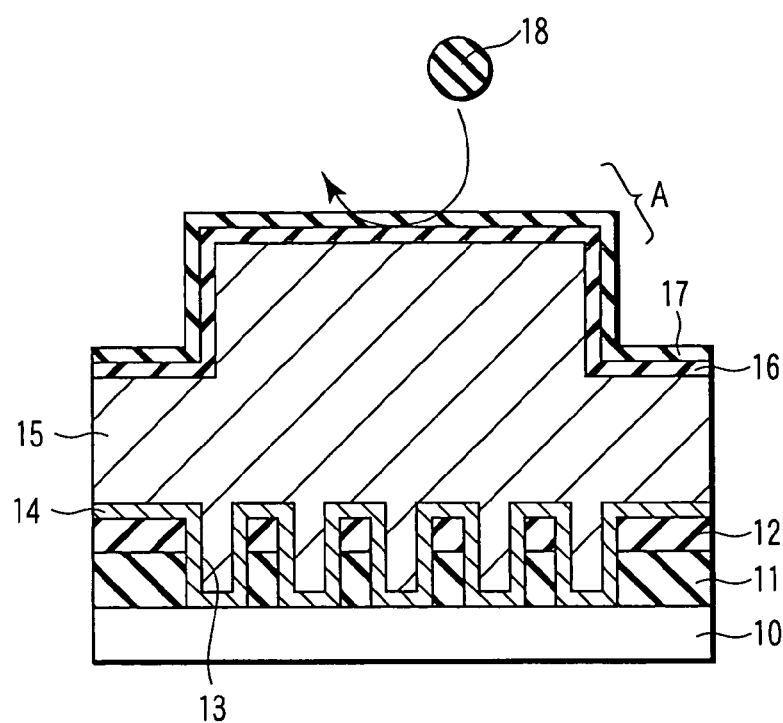
FIGS. 1A and 1B show respectively a schematic view illustrating the mechanism of polishing process of slurry according to one embodiment of the present invention.

Next, the embodiments of the present invention will be explained as follows.

It has been found out by the present inventors that, if the Cu-polishing power in the region of over-plating is to be enhanced while suppressing the generation of dishing, it is required not only to enhance the hydrophilicity of the polishing surface but also to incorporate a resin particle in slurry. Based on these findings, the slurry is formulated to contain, as components, a Cu oxidizing agent, an organic complexing agent, a surfactant, an inorganic particle, and a low concentration of a specific resin particle. Incidentally, by the term "erosion", it is intended to represent a total of dishing and thinning. By using the slurries according to the embodiment of the present invention, the generation of this erosion can be minimized.

As for the Cu oxidizing agent to be employed in the slurry for CMP according to the embodiments of the present invention, they include ammonium persulfate and hydrogen peroxide. In order to oxidize the surface of Cu film to form an oxide layer, the concentration of this oxidizing agent should preferably be at least 0.1% by weight. If this oxidizing agent is incorporated excessively, the solubility of the protective film (mainly water-insoluble complex) to be formed on the surface of Cu would be increased to promote the generation of corrosion or dishing. Therefore, the upper limit of the concentration of this oxidizing agent should preferably be confined to 5% by weight or so.

As for the complexing agent, it is possible to employ at least one selected from the group consisting of quinaldinic acid (quinoline carboxylic acid), quinolinic acid (pyridine-2,3-dicarboxylic acid), cinchomeronic acid (pyridine-3,4-dicarboxylic acid), BTA (benzotriazole), nicotinic acid (pyridine-3-carboxylic acid), picolinic acid, malonic acid, oxalic acid, succinic acid, glycine, alanine, pyridine-2,3,4-tricarboxylic acid, tryptophan, and potassium dodecylbenzene sulfonate. This complexing agent is capable of forming an organic complex with oxidized Cu. The organic complex to be formed herein may be considered as being a first hydrophobic protective film. For example, in the case of potassium dodecylbenzene sulfonate, the dodecylbenzene moiety exhibiting hydrophobicity is adsorbed onto a hydrophobic portion of the compound employed as a counterpart on the occasion of forming a complex. When potassium dodecylbenzene sulfonate is employed together with quinaldinic acid, a complex consisting of Cu/quinaldinic acid is adsorbed onto a hydrophobic portion of the Cu/dodecylbenzene sulfonate compound to form an insoluble complex (a first protective film).

The concentration of the complexing agent should preferably be confined within the range of 0.01 to 1% by weight. If the concentration of the complexing agent is lower than 0.01% by weight, it may become difficult to satisfactorily form the first protective film. On the other hand, if the concentration of the complexing agent is higher than 1% by weight, the ratio of the protective film (mainly, water-insoluble complex) to be formed on the surface of Cu would be increased to considerably reduce the polishing rate.

As for the surfactant, almost any kind of surfactant can be employed without raising any problem as long as the surfactant is a nonionic surfactant. This surfactant is enabled to act on the Cu-organic complex constituting the first protective film to form a second hydrophilic protective film on the first protective film. It is more preferable to employ a nonionic surfactant having a HLB (Hydrophile-Lipophile-Balance) value of 10 or more and a weight average molecular weight of 10,000 or less. Herein, this HLB value is determined by actual measurement. Specifically, the HLB value can be obtained by getting an eluted volume by using gel permeation chromatography. If the HLB value of the surfactant is less than 10, the surfactant may become less soluble in an aqueous solution. In order to suppress the flocculation of particles and organic compounds, it is desirable that the HLB value of the surfactant is 10 or more. Since increase of solubility of the first protective film would give rise to an increase of dishing and corrosion, the HLB value of the surfactant should preferably be confined to 18 or less.

If the weight average molecular weight of the surfactant exceeds 10,000, the protective film (mainly, water-insoluble complex) to be formed on the surface of Cu would become stronger excessively, thus possibly reduce the polishing rate to a great extent in the step of CMP. As for the lower limit of the weight average molecular weight of the surfactant, although there is not any particular limitation, it is preferable, in view of the stability thereof in slurry or the easiness of mechanical polishing of the protective film formed on the surface of Cu, to confine this lower limit to the range of about 300 to 3000.

As for the surfactants, they include acetylene diol-based nonione, polyoxyethylene alkylether, etc. In order to sufficiently form the second hydrophilic protective film, the concentration of the surfactant should preferably be at least 0.01% by weight or more. Further, in order to prevent the generation of undesirable problems such as the intermingling or dissolution thereof into the protective film (mainly, water-insoluble complex) to be formed on the surface of Cu, the upper limit of the surfactant should preferably be confined to about 0.5% by weight.

As for the inorganic particle, it can be selected from at least one selected from the group consisting of colloidal silica, fumed silica, colloidal alumina, fumed alumina, colloidal titania and fumed titania. It is preferable that these inorganic particles have a primary particle diameter ranging from 10 to 50 nm, and a secondary particle diameter ranging from 10 to 100 nm. If the size of these inorganic particles falls outside these ranges, various problems may be caused to occur. For example, it may become difficult to sufficiently suppress the generation of dishing or scratches may be generated to a great extent. As for the concentration of the inorganic particles, it may be about 0.1 to 5% by weight. If the concentration of the inorganic particles is less than 0.1% by weight, it may become difficult to achieve a practical polishing rate. On the other hand, if the concentration of the inorganic particles is more than 5% by weight, the dispersibility thereof would be reduced.

As for the resin particle, it is possible to employ those containing polystyrene and having an average particle diameter of less than 100 nm. Since polystyrene is capable of providing the resin particle with a suitable hardness, the resin particle may contain other resins such as polymethyl methacrylate (PMMA), etc., as long as the content of polystyrene is 0.05% by weight or more based on the total weight of the slurry. The average particle diameter of the resin particle can be determined in such a way that the surface area of the particle is measured by BET method, and the surface area thus obtained is converted into a spherical area to determine the particle diameter thereof, thus calculating the average particle diameter. Alternatively, it is possible to calculating the average particle diameter by measuring the particle diameter of electron microphotography.

In order to confine the residual Cu and dishing after CMP to desirable ranges, the average particle diameter of the resin particle is limited to less than 100 nm in the embodiments of the present invention. If it is desired to substantially eliminate the Cu residue (0 nm) and to concurrently suppress the magnitude of dishing to about 20 nm or less, the average particle diameter of the resin particle should preferably be confined to 50 nm or less. On the other hand, in view of easiness in controlling the particle size in the step of synthesis, the lower limit of the average particle diameter of the resin particle should preferably be 20 nm or more.

The concentration of the resin particle in the slurry is confined to less than 1% by weight. If the concentration of the resin particle is 1% by weight or more, it may become impossible to suppress the generation of dishing to a predetermined range. More preferably, the concentration of the resin particle should be confined within the range of 0.05% by weight to 0.95% by weight.

In order to minimize the generation of dishing in the slurry of the embodiments of the present invention, it is imperative to prevent the flocculation among the inorganic particle and the resin particle through a strong electric attraction between these particles. Unless these particles are electrified to the opposite polarities, the inorganic particle is incapable of flocculating with the resin particle. Therefore, it is necessary to control the polarity of the surface of the resin particle through the effects of the functional group thereof.

The polarity of the inorganic particle, etc., can be determined by measuring ζ-potential by using a laser Doppler method ζ-potential measuring apparatus ("Zeta Plus", BROOKHAVEN INSTRUMENTS Co., Ltd.). On the occasion of measuring the ζ-potential, the inorganic particle is dispersed in water, etc., to prepare a dispersion having a predetermined pH. By measuring this dispersion by using the aforementioned ζ-potential measuring apparatus, the ζ-potential of the inorganic component at an optional pH can be obtained. If the ζ-potential of a functional group is to be measured, a predetermined functional group is linked to the surface of the resin particle and dispersed in water, etc., to obtain a dispersion having a predetermined pH. Thereafter, the ζ-potential of a functional group is measured in the same manner as described above.

The ζ-potential of an inorganic particle fluctuates depending on the value of pH. For example, the ζ-potential of silica is zero (isoelectric point) at pH=1.4, and when pH thereof becomes higher than 1.4, the ζ-potential of silica becomes minus. The ζ-potential of alumina is zero at pH=7, and when pH thereof becomes lower than 7, the ζ-potential of alumina becomes plus. On the other hand, with respect to functional group, in the case of carboxylic group (COOH), there is no isoelectric point, and the ζ-potential thereof is minus in the entire pH region (0.5-14). The ζ-potential of amino group ($NH_2$) is plus in the entire pH region.

Depending on the kind and pH of inorganic particle, a predetermined functional group is linked to the surface of resin particle so as to make the resin particle become the same in kind of polarity as that of the inorganic particle. The functional group can be selected for example from the group consisting of carboxylic group, sulfonyl group and amino group. These functional groups may be those existing on the surface of resin particle in a slurry or may be those included in a component to be separately added. For example, by adding 0.001 to 1% by weight of KDS (potassium dodecylbenzene sulfonate) to a slurry, the polarity of the surface of resin particle can be controlled. Since dodecylbenzene moiety is hydrophobic in this potassium dodecylbenzene sulfonate, this potassium dodecylbenzene sulfonate adsorbs onto the resin particle having hydrophobic surface, thus enabling the sulfonic acid group to act as a functional group. However, it has been confirmed that in a case where a functional group is already adsorbed onto the surface of the resin particle, most of the sulfonic acid groups of potassium dodecylbenzene sulfonate are incapable of acting as a functional group.

Alternatively, at least either one of the inorganic particle and the functional group may be isoelectric point. By the term "isoelectric point", it is intended to indicate that the ζ-potential measured by using the aforementioned ζ-potential measuring apparatus falls within the range of 0±5 mV. On the basis of the pH where the ζ-potential becomes zero, even if the pH fluctuates within the range of ±1, the electric potential of the surface of particle would become unstable. Therefore, this range of potential can be assumed as being isoelectric point. For example, the ζ-potential of polystyrene particle having sulfonic acid group ($SO_3H$) as a functional group is nearly zero under the condition of pH=nearly 2. Namely, the inorganic particle and the functional group are employed in combination so as not to render the surface thereof to become opposite in polarity.

The slurry for CMP according to the embodiments of the present invention can be prepared by dispersing the aforementioned components in a dispersion medium. As for this dispersion medium, it is possible to employ water such as pure water and ion-exchange water, alcohols.

If required, the slurry according to the embodiments of the present invention may contain various additives such as an oxidation inhibitor, a pH adjustor, etc.

Next, the mechanism of the polishing process where a slurry according to one embodiment of the present invention was employed will be explained with reference to FIGS. 1A and 1B.

Figure 1B:
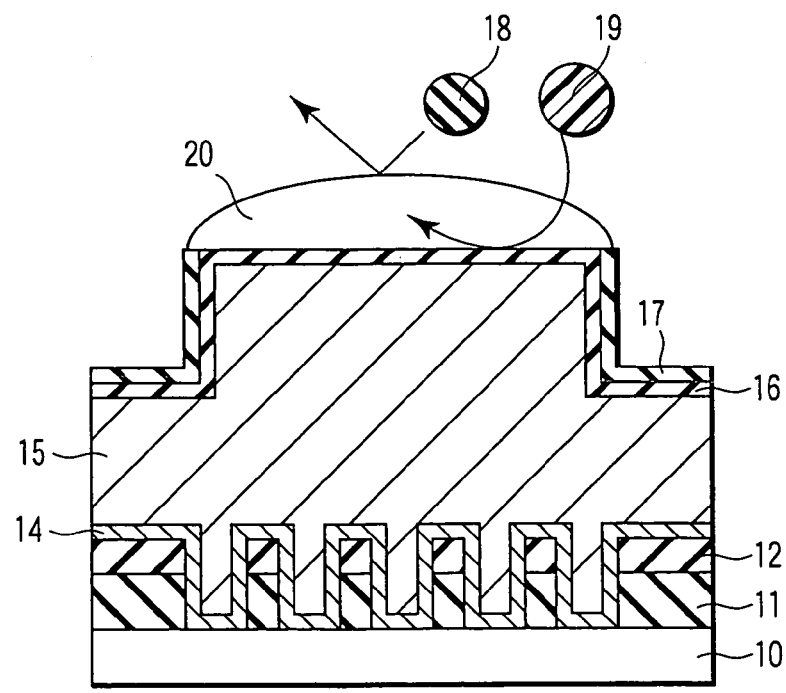

As shown in FIG. 1A, a laminated insulating film comprising, for example, LKD5109 (JSR Co., Ltd.) film 11 and a black diamond (AMAT Co., Ltd.) film 12 is deposited on a semiconductor substrate 10, and then, recessed portions 13 having a width of 0.07 μm are formed in the laminated insulating film. Further, by plating method, a Cu film 15 is deposited on the laminated film with a Ta film 14 being interposed therebetween, thus creating an over-plating portion "A".

On the occasion of polishing the Cu film 15 by using the slurry according to the embodiment of the present invention, Cu is oxidized by an oxidizing agent as described above, and at the same time, due to the effect of the complexing agent, a first protective film 16 comprising a Cu organic complex is formed on the Cu film 15. Incidentally, this first protective film 16 is hydrophobic. Further, due to the effect of the surfactant, a second protective film 17 which is hydrophilic is formed on the first protective film 16.

Since the surface of the inorganic particle 18 to be included in the slurry is hydrophilic, if the polishing surface (the surface to be polished) is hydrophilic, the inorganic particle 18 in the slurry becomes quite compatible with the polishing surface, thus proceeding the polishing as shown in FIG. 1A.

However, since the over-plating portion "A" is protruded as shown in FIG. 1A, the load to be imposed on the occasion of polishing would become larger than the field portion. Further, the temperature of the over-plating portion "A" would become higher also and shavings (hydrophobic) are more likely to be accumulated on the polishing surface. Because of these phenomena, as the polishing is advanced, the first protective film 16 is exposed on the top surface of the over-plating portion "A" as shown in FIG. 1B, thereby rendering the polishing surface to become hydrophobic. In the vicinity of this hydrophobic surface, a water repellent region 20 is formed, so that hydrophilic inorganic particle 18 cannot approach this region 20. On the other hand, the resin particle 19 easily enters into this water repellent region 20 to perform the polishing thereof. As a result, it is now possible to enhance the polishing power at this over-plating portion "A".

Since the slurry according to the embodiment of the present invention contains an oxidizing agent, a complexing agent, a surfactant, an inorganic particle and a resin particle meeting predetermined conditions, it is now possible to proceed the polishing of the over-plating portion "A" according to the aforementioned mechanism. As a result, the polishing can be performed at a sufficiently high polishing rate while suppressing the generation of erosion.

Embodiment 1

The following components (a) to (e) were added to pure water employed as a solvent to prepare a slurry sample 1.
Oxidizing agent (a): Ammonium persulfate=2 wt %;
Complexing agent (b): Quinaldinic acid=0.2 wt %, Quinolinic acid=0.25 wt %, Alanine=0.25 wt %, and Potassium dodecylbenzene sulfonate=0.04 wt %;
Surfactant (c): Acetylene diol-based nonionic surfactant (molecular weight=about 1500, HLB value=18)=0.1 wt %;
Inorganic particle (d): colloidal silica (25 nm)=0.4 wt %
Resin particle (e): Cross-linked polystyrene=0.5 wt %, average particle diameter=50 nm, surface functional group=COOH.

The resin particle employed herein can be manufactured according to a known method. For example, divinyl benzene, methacrylic acid, hydroxyethylacrylate, ammonium lauryl sulfate and ammonium persulfate were dissolved in pure water. The resultant mixture was allowed to polymerize for 6 hours with stirring in a nitrogen gas atmosphere and at an increased temperature of 70° C. As a result, it was possible to obtain a resin particle consisting of cross-linked polystyrene having, as a functional group, COOH group on the surface thereof. Incidentally, the yield of polymerization was 95%. With respect to the distribution of carboxylic groups as measured by conductometric method was: 40% in the interior of particle; 50% on the surface of particle; and 10% in aqueous phase. When the average particle diameter of the resin particle was measured by TEM observation, the average particle diameter thereof was 50 nm.

Further, KOH was added as a pH adjustor to the slurry to adjust the pH thereof to 9. Under this condition of pH=9, the silica employed as an inorganic particle and COOH on the surface functional group of the resin particle were all electrified as negative.

Seven slurry samples were prepared according to the same procedures as described above except that at least one selected from the complexing agent (component b), the surfactant (component c), the inorganic particle (component d) and the resin particle (component e) was not incorporated in the slurry. These slurry samples were represented by the symbols (c-1) to (c-7). Since some of the components were not included in these slurries, slurries C1-C7 should not be construed as falling within the scope of the present invention.

By using these slurries thus prepared, Cu-CMP was performed according to the following procedures, thereby investigating the conditions of the Cu film after polishing.

Figure 2A:
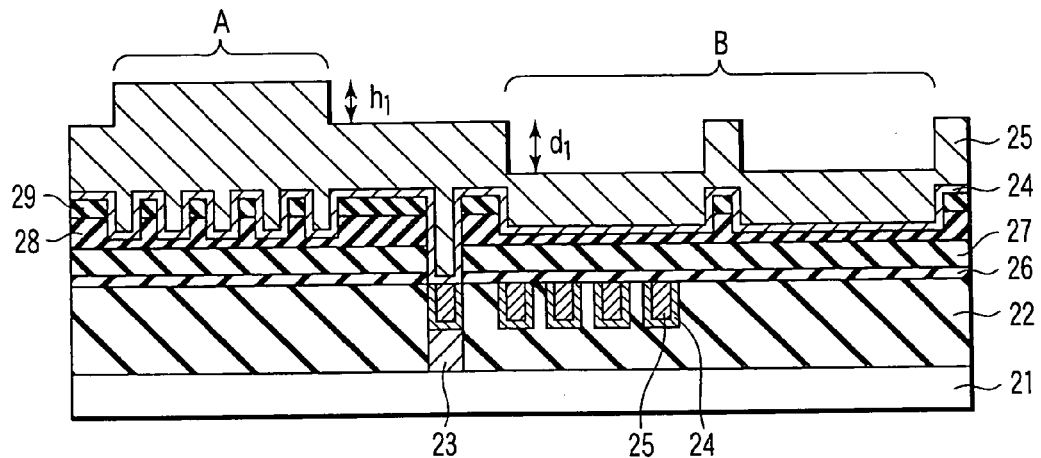
FIGS. 2A to 2C are cross-sectional views each illustrating, in stepwise, the method of manufacturing a semiconductor device according to one embodiment of the present invention.
Figure 2B:
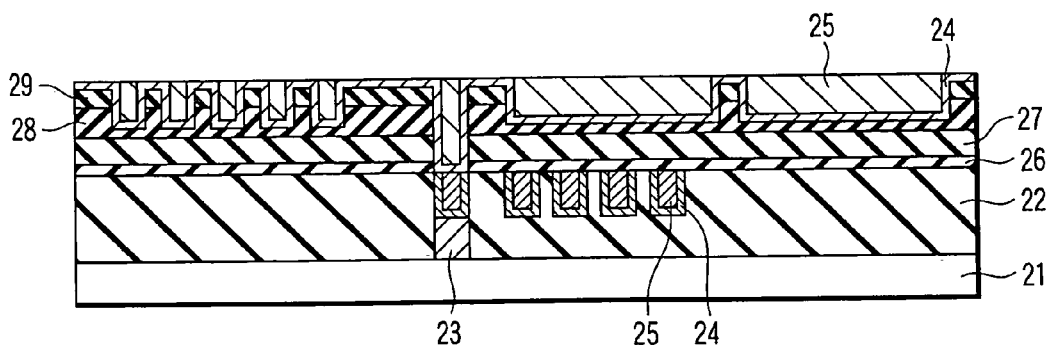
Figure 2C:
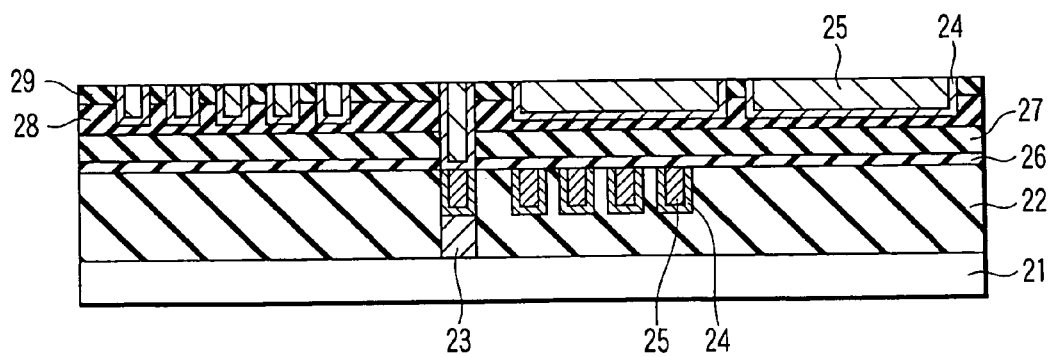

FIGS. 2A to 2C are cross-sectional views illustrating the steps of Cu-CMP.

An insulating film was deposited on a semiconductor substrate having a first layer of Cu damascene wiring formed thereon. Then, as shown in FIG. 2A, recessed portions were formed in the insulating film and a Cu film was deposited the entire surface. More specifically, a W plug 23 (0.1 µm in diameter, 400 nm in thickness) was buried in an inorganic insulating film 22 (500 nm in film thickness) which was formed on a semiconductor substrate 21. At the same time, a Cu film 25 (90 nm in film thickness) was buried, through a Ta film 24 (10 nm in film thickness), in the inorganic insulating film 22, thereby forming a first layer of Cu damascene wiring.

On the resultant substrate, insulating films such as an SiN film 26 (20 nm in film thickness), LKD5109 (JSR Co., Ltd.) film 27 (180 nm in film thickness), a black diamond (AMAT Co., Ltd.) film 28 (80 nm in film thickness) and an inorganic $SiO_2$ film 29 (40 nm in film thickness) were successively deposited.

Wiring trenches having a wiring width of 0.07 µm and a wiring width of 30 µm were formed in the black diamond (AMAT Co., Ltd.) film 28 and in the inorganic $SiO_2$ film 29. Further, via-holes (0.1 µm in diameter) were formed in the SiN film 26 and in the LKD5109 (JSR Co., Ltd.) film 27.

As shown in FIG. 2A, by plating method, the Cu film 25 (400 nm in film thickness) was deposited through the Ta film 24 (10 nm in film thickness) on the entire surface of the insulating film having formed therein recessed portions including the wiring trenches and via-holes.

Due to the characteristics of plating, in a region where a wiring trench having a width of 0.07 µm was formed, the Cu film was deposited thickly because of over-plating (over-plating portion "A") as shown in FIG. 2A. In this FIG. 2A, the height of the projected Cu portion is indicated by $h_1$. On the other hand, in the region "B" where a wiring trench having a width of 30 µm was formed, a Cu film having the same thickness as that of the field portion was deposited starting from the bottom of the trench. The depth of the recessed portion of the Cu film is indicated by $d_1$ herein.

The Cu film 25 thus formed was removed by CMP while leaving part of the Cu film 25 in the trenches, thereby forming a second layer of Cu damascene wiring.

On the occasion of this CMP, a redundant portion of the Cu film 25 was removed to expose the surface of the Ta film 24 (1st polishing) as shown in FIG. 2B, and then, a redundant portion of the Ta film 24 was removed to expose the surface of the inorganic $SiO_2$ film 29 (2nd polishing) as shown in FIG. 2C.

In the step of the first polishing, the aforementioned slurry was employed. Then, the height of the projected Cu portion left remained at the over-plating portion "A" having a wiring width of 0.07 µm after the CMP, as well as the magnitude of dishing generated in the region "B" having a wiring width of 30 µm were investigated. The details of this polishing will be explained hereinafter.

In the step of the second polishing to remove the Ta film 24, the polishing rate of the Cu film was harmonized with the polishing rate of the $SiO_2$ film, so that the second polishing was performed for a time period required for erasing the $SiO_2$ film 29 up to a thickness of 40 nm. The polishing rate of the Ta film 24 should preferably be about 2 to 5 times faster than the polishing rate of the Cu film. Since the $SiO_2$ film 29 is a protective film for the black diamond film 28, it is preferable that the $SiO_2$ film 29 is left behind keeping a thickness of at least 8 nm.

In this embodiment, in view of ensuring the in-plane uniformity of the $SiO_2$ polishing rate in the second polishing, the residual film thickness was set to 25 nm. This can be achieved for example by performing the polishing for 35 seconds by feeding, as a slurry, CMS8301 (JSR Co., Ltd.) onto polishing cloth (IC1000 (Rodel Co., Ltd.)) at a flow rate of 200 cc/min and by allowing a top ring holding a semiconductor substrate to contact with the polishing cloth at a polishing load of 300 gf/cm² while rotating the top ring and a turntable at a speed of 20 rpm. Incidentally, when the film thickness of the Ta film 24 is 5 nm or less, the second polishing may be omitted.

Figure 3:
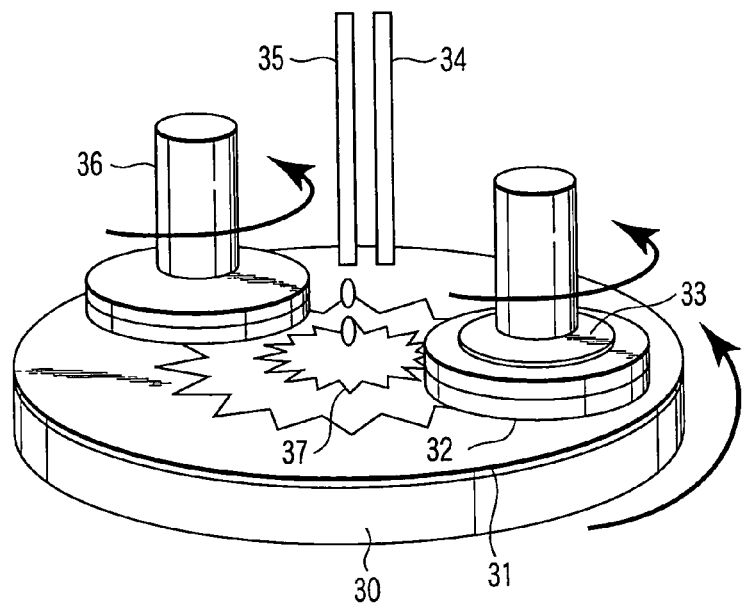
FIG. 3 is a schematic view illustrating a state of CMP.

On the other hand, the polishing of the Cu film 25 in the first polishing step was performed using the aforementioned slurry in the following manner. Namely, as shown in FIG. 3, while rotating a turntable 30 having a polishing pad 31 attached thereto at a speed of 100 rpm, a top ring 33 holding a semiconductor substrate 32 was allowed to contact with the turntable 30 at a polishing load of 300 gf/cm². The rotational speed of the top ring 33 was set to 102 rpm, and slurry 37 was fed onto the polishing pad 31 from a slurry supply nozzle 35 at a flow rate of 200 cc/min. The polishing time was determined from the descending point of the table current. The over-polishing was performed to such an extent that corresponds to (the time which part of the polishing cloth 31 was enabled to reach the Ta film 24)×30%. Incidentally, FIG. 3 also shows a water supply nozzle 34 and a dresser 36.

Figure 4:
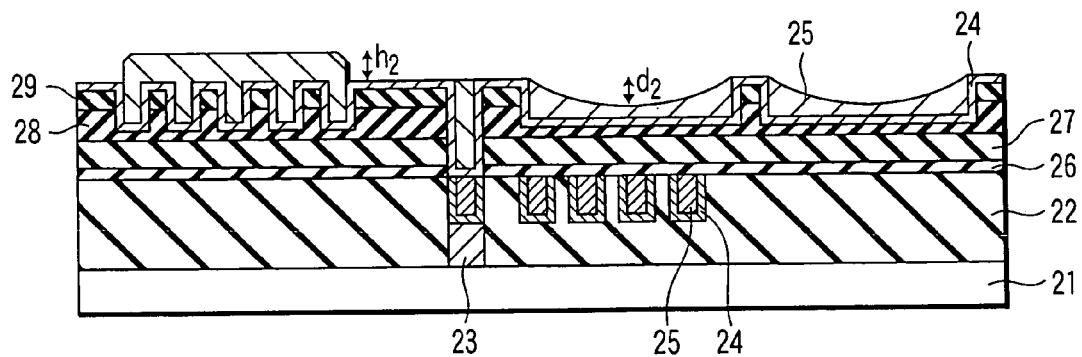
FIG. 4 is a cross-sectional view schematically illustrating a state after a first polishing step according to the prior art.

Although it may be ideal to make the surface of the Cu film 25 flat uniformly after finishing the first polishing as shown in FIG. 2B, it may occasionally permit, as shown in FIG. 4, the residue of projected Cu portion to remain in the region (over-plating portion "A") of: 0.07 μm in wiring line width, 50% in coverage and 2000 μm² in area. On the other hand, in the region (30 μm wiring line width region "B") of: 30 μm in wiring line width, 90% in coverage and 2000 μm² in area, dishing may be generated. In FIG. 4, the height of the projected Cu portion after the CMP is represented by $h_2$ and the magnitude of dishing is represented by $d_2$. If the projected Cu portion $h_2$ can be confined to 2 nm or less and the magnitude of dishing $d_2$ can be confined to 30 nm or less, they would not give any substantial influence to the product and hence they are permissible.

The results obtained from the employment of these slurry samples after the first polishing are summarized in the following Table 1.

film, thereby dissolving the Cu film uniformly in the step of CMP. As a result, even in the recessed portions, the Cu film is assumably dissolved at almost the same speed as that of the projected portions, thus increasing the magnitude of dishing.

Then, the effects of the average particle diameter and concentration of the resin particle on the generation of dishing were investigated. By controlling the average particle diameter of the resin particle through the adjustments of stirring temperature, the timing of charging additives, mixing time or mixing speed, various cross-linked polystyrene resin particles were synthesized. In the same manner as described above, COOH group was bonded to the surface of each resin particles.

A plurality of slurry samples were prepared according to the same procedures as in the case of the slurry sample 1 except that the aforementioned various resin particles were substituted for the resin particle of the slurry sample 1. The polishing of the Cu film by the aforementioned first polishing was performed under the same conditions as described above. The features of the Cu film after the first polishing were investigated, the results being summarized in the following Table 2 together with the average particle diameter and concentration of each of the resin particles.

TABLE 2

| No. | Average particle diameter (nm) | Concentration (wt %) | Projected Cu (height in nm) 0.07 μm portion | Dishing (height in nm) 30 μm portion |
|---|---|---|---|---|
| 2 | 20 | 0.01 | 2 | 18 |
| 3 |    | 0.05 | 0 | 18 |
| 4 |    | 0.1  | 0 | 18 |
| 5 |    | 0.5  | 0 | 20 |
| 6 |    | 0.95 | 0 | 20 |

TABLE 1

| No. | Components | | | | Projected Cu (height in nm) 0.07 μm portion | Dishing (height in nm) 30 μm portion |
| | b | c | d | e | | |
|---|---|---|---|---|---|---|
| 1   | Included | Included | Included | Included | 0   | 20  |
| C-1 | Included | Included | Included | None     | 23  | 25  |
| C-2 | Included | Included | None     | Included | 175 | 100 |
| C-3 | Included | None     | Included | Included | 45  | 50  |
| C-4 | None     | Included | Included | Included | 30  | 62  |
| C-5 | None     | None     | Included | Included | 0   | 100 |
| C-6 | None     | None     | None     | Included | 0   | 100 |
| C-7 | None     | None     | Included | None     | 0   | 100 |

As shown in Table 1, in the case of the slurry sample 1, the presence of the projected Cu portion after the CMP was zero in the 0.07 μm lines width region, and the magnitude of dishing in the 30 μm line width region was confined to 20 nm. Whereas, in the case of the slurries C-1 to C-7 however, since some of the components were not included therein, it was impossible to concurrently satisfy the conditions required of the projected Cu portion and the dishing.

In particular, in the case of the slurries C-5 to C-7, although it was possible to reduce the projected Cu portion, the magnitude of dishing was considerably increased. Due to the non-existence of the complexing agent (component b) or the surfactant (component c) in the slurry, it was impossible to form a satisfactory protective film on the surface of the Cu TABLE 2-continued

| No. | Average particle diameter (nm) | Concentration (wt %) | Projected Cu (height in nm) 0.07 μm portion | Dishing (height in nm) 30 μm portion |
|---|---|---|---|---|
| 7  |    | 0.99 | 0 | 28 |
| 8  |    | 1    | 0 | 33 |
| 9  | 50 | 0.01 | 2 | 15 |
| 10 |    | 0.05 | 0 | 20 |
| 11 |    | 0.1  | 0 | 18 |

TABLE 2-continued

| No. | Average particle diameter (nm) | Concentration (wt %) | Projected Cu (height in nm) 0.07 μm portion | Dishing (height in nm) 30 μm portion |
|---|---|---|---|---|
| 12 |  | 0.5 | 0 | 20 |
| 13 |  | 0.95 | 0 | 20 |
| 14 |  | 0.99 | 1 | 26 |
| 15 |  | 1 | 0 | 32 |
| 16 | 99 | 0.01 | 2 | 19 |
| 17 |  | 0.05 | 0 | 20 |
| 18 |  | 0.1 | 0 | 26 |
| 19 |  | 0.5 | 0 | 26 |
| 20 |  | 0.95 | 0 | 26 |
| 21 |  | 0.99 | 0 | 29 |
| 22 |  | 1 | 0 | 34 |
| 23 | 100 | 0.01 | 5 | 28 |
| 24 |  | 0.05 | 0 | 31 |
| 25 |  | 0.1 | 0 | 35 |
| 26 |  | 0.5 | 0 | 35 |
| 27 |  | 0.95 | 0 | 36 |
| 28 |  | 0.99 | 0 | 37 |
| 29 |  | 1 | 0 | 42 |

As shown in Table 2, in the case of the samples wherein the resin particle having an average particle diameter of 99 nm or less was incorporated at a concentration of not more than 0.99% by weight, it was possible to confine the magnitude of the projected Cu portion and of the dishing after the CMP to allowable ranges, respectively. In the case of the samples wherein the resin particle having an average particle diameter ranging from 20 to 50 nm was incorporated at a concentration ranging from 0.05 to 0.95% by weight, it was possible to reduce the magnitude of the projected Cu portion to 0 nm and to further minimize the magnitude of dishing as clearly seen from Table 2.

Next, a plurality of slurry samples were prepared according to the same procedures as in the case of the slurry sample 1 except that the resin particle and the functional group were altered. The silica employed herein as an inorganic particle was negative in polarity under the condition of: pH=9. By using the samples thus obtained, the polishing of the Cu film by the aforementioned first polishing was performed under the same conditions as described above. The features of the Cu film after the first polishing were investigated, the results being summarized in the following Table 3 together with the kinds of resin particle and the kinds of functional group.

TABLE 3

| No. | Kinds of resin | Functional group etc. | Projected Cu (height in nm) 0.07 μm portion | Dishing (height in nm) 30 μm portion |
|---|---|---|---|---|
| 30 | Crosslinked | $SO_3H$ | 0 | 22 |
| 31 | polystyrene | $NH_2$ | 0 | 36 |
| 32 |  | $COOH/SO_3H$ | 0 | 20 |
| 33 |  | $NH_2/COOH$ | 0 | 28 |
| 34 |  | $NH_2/SO_3H$ | 0 | 26 |
| 35 | Polystyrene | COOH | 0 | 21 |
| 36 | PMMA |  | 7 | 30 |
| 37 | Styrene/MA composite |  | 1 | 27 |
| 38 | Polystyrene 0.25 wt % PMMA 0.25 wt % |  | 1 | 29 |
| 39 | Crosslinked polystyrene |  | 0 | 20 |
| 40 | Crosslinked PMMA |  | 5 | 29 |
| 41 | Crosslinked polystyrene | KDS | 0 | 28 |
| 42 | Crosslinked polystyrene | Modified silica | 3 | 38 |

The functional group to be bonded to the surface of the resin particle can be altered by following the same procedures as described above. For example, if the functional group is to be changed to amino group, it can be realized by following the same procedures as described above except that methacrylic acid, hydroxyethylacrylate, ammonium lauryl sulfate and ammonium persulfate are substituted by methoxy polyethylene glycol methacrylate, 4-vinylpyridine, azo-type polymerization initiator. If sulfonyl group is to be employed, the quantity of persulfuric acid and lauryl sulfate may be increased.

The resin particle made of PMMA was manufactured as follows. Methylmethacrylate, methacrylic acid, hydroxymethylmethacrylate, ammonium lauryl sulfate and ammonium persulfate were dissolved in pure water. The resultant mixture was then allowed to polymerize for 6 hours with stirring in a nitrogen gas atmosphere and at a temperature of 70° C. As a result, it was possible to obtain a polymethylmethacrylate-based resin particle having carboxylic group and hydroxyl group, an average particle diameter thereof being 0.17 μm.

A styrene/MA composite of the sample 37 was synthesized through a reaction between styrene and methacrylic (MA) acid. In the sample 38, a mixture comprising the particle of sample 35 and the particle of sample 36 was employed.

The crosslinked PMMA of the sample 40 can be obtained through the crosslinking of PMMA using divinyl benzene as a crosslinking agent for instance.

As shown in Table 3, when the polarity of the inorganic particle is negative, the polarity of the functional group to be applied to the surface of the resin particle should be also negative ($SO_3H$ group, COOH group) so as to obtain desirable results. Further, as in the cases of samples No. 33 and No. 34, almost the same effects would be obtainable even if the particles are electrically neutral (isoelectric point).

In the case of the resin particle of No. 41, the functional group was introduced into the slurry by separately adding 0.01% by weight of KDS without bonding the functional group to the surface of the resin particle. Due to the existence of this KDS, the polarity of the surface of the resin particle would become negative, thus making it possible to obtain almost the same effects as described above.

However, since amino group ($NH_2$) is cationic, the resin particle would be strongly flocculated with silica particles. Therefore, it would be impossible to minimize the generation of dishing in the case of No. 31.

The modified silica employed in sample No. 42 was manufactured in such a manner that Υ-glycidoxypropyl trimethoxy silane, tetraethyl orthosilicate, aqueous ammonia and potassium hydroxide were added to a dispersion containing polystyrene particle to silicify the surface of the particle. In this sample, most of the surface of the resin particle is replaced by the inorganic substances so that it is impossible to concurrently minimize the development of the projected Cu portion and the dishing. It is clearly indicated that the presence of predetermined functional group on the surface of the resin particle is indispensable.

It will be recognized from the results of Table 3 that the results after the CMP would become more excellent in the order of PMMA, crosslinked PMMA, polystyrene, and crosslinked polystyrene. It is more preferable that the resin particle is hardened. There is not any particular limitation with respect to the degree of hardness.

Then, the effects to be derived from the combination between the functional group on the surface of the resin particle and the inorganic particle were confirmed.

As for the inorganic particle, fumed alumina and fumed titania were prepared. These inorganic particles were all 20 nm in primary particle diameter and 0.1 μm in secondary particle diameter. Further, two kinds of resin particles were prepared by bonding COOH or $NH_2$ to the surface of crosslinked polystyrene particle having an average particle diameter of 30 nm. Then, four samples were prepared by following the same procedures as those of the aforementioned sample No. 1 except that the aforementioned inorganic particles and resin particles were employed in combination. The concentration of the inorganic particles and of the resin particles were all set to 0.5% by weight.

The slurry samples thus obtained were employed in the first polishing to polish the Cu film under the same conditions as described above. The features of the Cu film after the first polishing were investigated, the results being summarized in the following Table 4 together with the kinds of inorganic particle and the kinds of functional group.

TABLE 4

| No. | Inorganic particle | Functional group | Projected Cu (height in nm) 0.07 μm portion | Dishing (height in nm) 30 μm portion |
|---|---|---|---|---|
| 43 | Alumina | COOH | 0 | 28 |
| 44 |  | $NH_2$ | 0 | 50 |
| 45 | Titania | COOH | 0 | 28 |
| 46 |  | $NH_2$ | 0 | 60 |

As shown in Table 4, when alumina and titania were employed in combination with COOH (No. 43, No. 45), it was possible to greatly minimize the development of the dishing. Since the polarity of alumina and titania were all negative under the pH of the slurries prepared herein, if $NH_2$ was employed as a functional group, they would become opposite in polarity (No. 44, No. 46). As a result, the flocculation between the inorganic particles and the resin particles was caused to generate to increase the magnitude of dishing.

In the cases of samples No. 43, No. 45, it was recognized that the polishing rate of Cu was increased by 10% and the generation of shallow scratches in the semiconductor substrate was minimized in addition to decrease of dishing. Additionally, the adhesion between the LKD5109 film 27 and the black diamond film 28, as well as the adhesion between the black diamond film 28 and the Ta film 24 were enhanced, and hence peeling of film at the interface between these films was not recognized at all.

The electric potential of the inorganic particle in a slurry can be controlled to positive or negative through the adjustment of pH. Therefore, depending on the degree of pH of the slurry, a resin particle having $NH_2$ as a functional group is enabled to be employed. For the purpose of confirming this, samples of slurry were prepared in the same manner as employed in the sample No. 44 except that the pH thereof was adjusted to 4 or 7. More specifically, a sample (No. 47) having pH=4 was prepared without the addition of KOH, and another sample (No. 48) having pH=7 was prepared by adjusting the addition of KOH. Alumina is electrified positively under pH=4 and has no electric potential (isoelectric point) under pH=7. On the other hand, $NH_2$ is electrified positively under pH=1-12.

By using these samples in the first polishing, the polishing of the Cu film was performed under the same conditions as described above. The features of the Cu film after the first polishing were investigated, the results being summarized in the following Table 5 together with the kinds of inorganic particle and the kinds of functional group.

TABLE 5

| No. | Inorganic particle | Functional group | pH | Projected Cu (height in nm) 0.07 μm portion | Dishing (height in nm) 30 μm portion |
|---|---|---|---|---|---|
| 47 | Alumina | $NH_2$ | 4 | 2 | 25 |
| 48 |  | $NH_2$ | 7 | 1 | 27 |

As shown in Table 5, even when $NH_2$ was employed, if the surface potential of the inorganic particle was made identical with that of the resin particle or if the inorganic particle was rendered to fall within the region of isoelectric point, it was possible to derive the effects of minimizing the dishing.

Embodiment 2

The following components (a) to (e) were added to pure water employed as a solvent to prepare a slurry sample No. 49.

Oxidizing agent (a): Hydrogen peroxide=0.1 wt %;
Complexing agent (b): Quinolinic acid=0.25 wt %;
Surfactant (c): Polyoxyethylene alkylene ether (molecular weight=3000, HLB value=17)=0.05 wt %;
Inorganic particle (d): colloidal silica (25 nm)=3 wt %
Resin particle (e): Cross-linked polystyrene=0.8 wt %, average particle diameter=30 nm, surface functional group=COOH.

KOH was added as a pH adjustor to the slurry to adjust the pH thereof to 10. Under this condition of pH=10, the silica employed as an inorganic particle and COOH on the surface functional group of the resin particle were all electrified as negative.

A slurry sample of No. 50 was prepared by following the same procedures as explained above except that the resin particle was not employed.

Figure 5A:
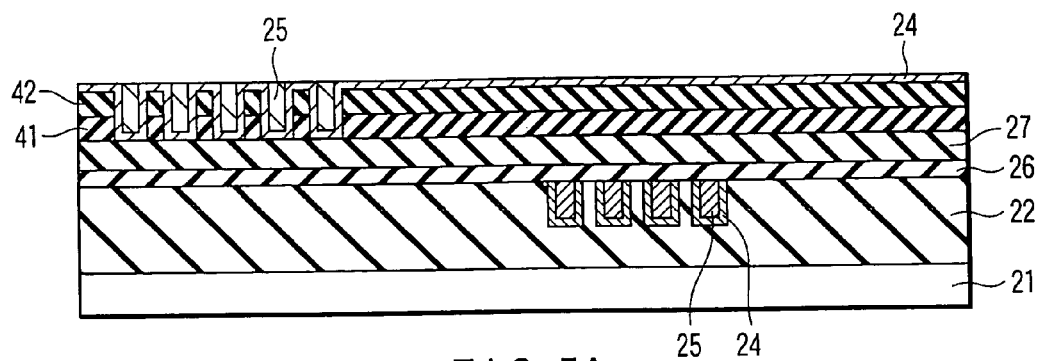
FIGS. 5A and 5B are cross-sectional views each illustrating, in stepwise, the method of manufacturing a semiconductor device according to another embodiment of the present invention.

The slurry thus prepared was applied to the second polishing (touch-up) in the fabrication of the Cu damascene wiring of Embodiment 1. The method employed will be explained with reference to FIGS. 5A and 5B.

A substrate having the same structure as that of FIG. 2A except that the black diamond film 28 was replaced by an LKD5109 (JSR Co., Ltd.) film having a thickness of 180 nm, the inorganic $SiO_2$ film 29 was replaced by a black diamond (AMAT Co., Ltd.) film 42 having a thickness of 100 nm, and the film thickness of the Ta film 24 was increased to 10 nm. Since the film thickness of the Ta film 24 was made relatively large, a higher polishing power was required for the touch-up. Further, in order to secure the yield in the short-circuit of wirings, the black diamond film was required to be erased by about 30 nm.

Figure 5B:
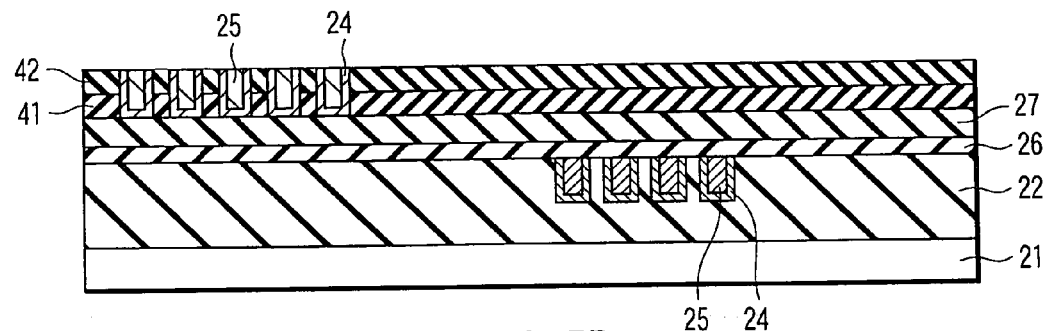

First of all, by using the No. 1 slurry, the first polishing was performed under the same conditions as described above to obtain the structure as shown in FIG. 5A. Then, by using the No. 49 slurry, the touch-up was performed to remove the Ta film 24 to enable the black diamond film 29 to expose with the surface thereof being made flat as shown in FIG. 5B.

Figure 6:
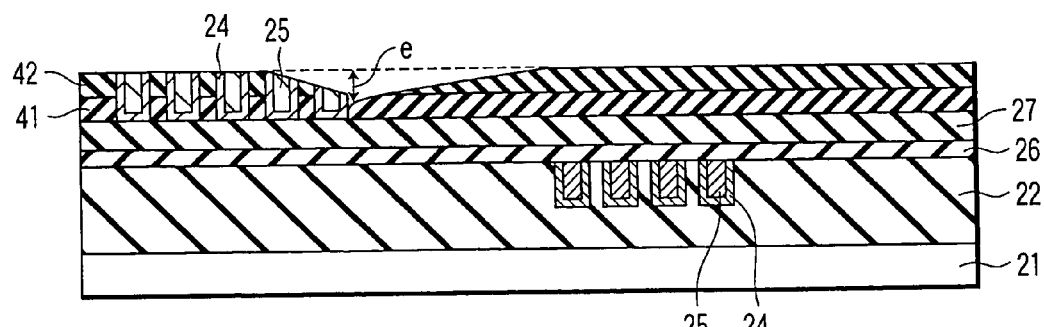
FIG. 6 is a cross-sectional view illustrating a state after touch-up step according to the prior art.

Whereas, when the touch-up was performed by using the No. 50 slurry containing no resin particle, abnormal polishing was generated as shown in FIG. 6 wherein the magnitude of erosion "e" was increased to 150 nm at maximum. When the slurries according to the embodiments of the present invention were employed, it was made possible to overcome this abnormal polishing.

Further, it was possible to greatly minimize the generation of peeling at the interfaces among the LKD5109 film 41, the black diamond film 42 and the Ta film 24. Moreover, the Cu film and the insulating films were inhibited to a great extent from being damaged by scratching or recessing.

It has been confirmed that it is possible, through the employment of a slurry containing an oxidizing agent, a complexing agent, a surfactant, an inorganic particle and a predetermined resin particle, to prevent the generation of erosion in the step of touch-up.

According to one aspect of the present invention, it is possible to provide a slurry which is capable of removing Cu located in an over-plating portion while minimizing the generation of dishing. According to another aspect of the present invention, it is possible to provide a method of polishing a Cu film having an over-plating portion at a practically acceptable polishing speed while suppressing the generation of dishing. According to further aspect of the present invention, it is possible to provide a method of manufacturing a semiconductor device excellent in reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polishing method comprising:
   contacting a polishing surface of a semiconductor substrate with a polishing pad attached to a turntable; and
   dropping a CMP slurry onto the polishing pad to polish the polishing surface, the CMP slurry comprising:
   a Cu oxidizing agent;
   a complexing agent forming a Cu organic complex;
   a nonionic surfactant which is incorporated at a concentration of 0.1 wt % or less;
   an inorganic particle; and
   a resin particle which is incorporated at a concentration of less than 1 wt %, contains polystyrene, has on the surface thereof a functional group of the same kind of polarity as that of the inorganic particle and has an average particle diameter ranging from 20 to 50 nm,
   wherein the complexing agent forms a hydrophobic protective film on the polishing surface, and the nonionic surfactant forms a hydrophilic protective film on the hydrophobic protective film.

2. The polishing method according to claim 1, wherein the polishing surface contains Cu.

3. The polishing method according to claim 1, wherein the resin particle in the CMP slurry is incorporated therein at a concentration ranging from 0.05 to 0.95 wt %.

4. The polishing method according to claim 1, wherein the surface functional group of the resin particle in the CMP slurry includes at least one selected from the group consisting of a carboxylic group, a sulfonyl group and an amino group.

5. The polishing method according to claim 1, wherein the nonionic surfactant in the CMP slurry has an HLB value of 10 to 18.

6. The polishing method according to claim 1, wherein the nonionic surfactant in the CMP slurry has a weight average molecular weight of 10,000 or less.

7. A method of manufacturing a semiconductor device comprising:
   forming an insulating film above a semiconductor substrate;
   forming a recessed portion in the insulating film;
   depositing a conductive material inside the recessed portion and above the insulating film to form a conductive layer; and
   removing the conductive material which is deposited above the insulating film by CMP using a CMP slurry to selectively leave the conductive material in the recessed portion, the CMP slurry comprising:
   a Cu oxidizing agent;
   a complexing agent forming a Cu organic complex;
   a nonionic surfactant which is incorporated at a concentration of 0.1 wt % or less;
   an inorganic particle; and
   a resin particle which is incorporated at a concentration of less than 1 wt %, contains polystyrene, has on the surface thereof a functional group of the same kind of polarity as that of the inorganic particle and has an average particle diameter ranging from 20 to 50 nm,
   wherein the conductive material is Cu and the conductive layer is a Cu layer, the Cu oxidizing agent oxidizes a surface of the Cu layer to form an oxidized Cu, the complexing agent forms an organic complex with the oxidized Cu, the organic complex constituting a hydrophobic protective film, and the nonionic surfactant forms a hydrophilic protective film on the hydrophobic protective film.

8. The method according to claim 7, wherein the conductive layer is a Cu film formed by plating.

9. The method according to claim 7, wherein the recessed portion includes wiring trenches comprising a first wiring trench and a second wiring trench, the first wiring trench having a first line width and being densely formed in a first region, and the second wiring trench having a larger line width than that of the first wiring trench and being formed in a second region.

10. The method according to claim 9, wherein the thickness of the conductive layer in the first region is larger than the thickness of the conductive layer in the second region.

11. The method according to claim 7, wherein the nonionic surfactant in the CMP slurry has an HLB value of 10 to 18.

12. The method according to claim 7, wherein the nonionic surfactant in the CMP slurry has a weight average molecular weight of 10,000 or less.

* * * * *